United States Patent
Rozenblit et al.

(10) Patent No.: US 6,466,069 B1
(45) Date of Patent: Oct. 15, 2002

(54) FAST SETTLING CHARGE PUMP

(75) Inventors: Dmitriy Rozenblit, Irvine; William J. Domino, Yorba Linda; Darioush Agahi, Irvine, all of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/718,615

(22) Filed: Nov. 21, 2000

(51) Int. Cl.$^7$ ................................................. H03L 7/06
(52) U.S. Cl. ........................................ 327/157; 327/158
(58) Field of Search ................................ 327/148, 149, 327/150, 157, 158, 160; 331/17, 25

(56) References Cited

U.S. PATENT DOCUMENTS

| | | |
|---|---|---|
| 4,931,749 A | 6/1990 | Walters |
| 5,066,870 A | 11/1991 | Kobatake |
| 5,233,314 A | 8/1993 | McDermott et al. |
| 5,392,205 A | 2/1995 | Zavaleta |
| 5,473,283 A * | 12/1995 | Luich ........................... 327/157 |
| 5,475,326 A * | 12/1995 | Masuda ........................ 327/157 |
| 5,491,439 A | 2/1996 | Kelkar et al. ................. 327/157 |
| 5,532,636 A * | 7/1996 | Mar et al. ..................... 327/157 |
| 5,629,650 A | 5/1997 | Gersbach et al. |
| 5,646,563 A | 7/1997 | Kuo .............................. 327/157 |
| 5,692,164 A | 11/1997 | Pantelakis |
| 5,703,511 A | 12/1997 | Okamoto ...................... 327/157 |
| 5,740,213 A | 4/1998 | Dreyer .......................... 327/157 |
| 5,767,736 A | 6/1998 | Lakshmikumar et al. ... 327/157 |
| 5,825,640 A * | 10/1998 | Quigley et al. .............. 327/157 |
| 5,870,003 A | 2/1999 | Boerstler |
| 5,886,551 A | 3/1999 | Narahara ...................... 327/157 |
| 5,912,575 A * | 6/1999 | Takikawa ..................... 327/157 |
| 5,920,233 A | 7/1999 | Denny |
| 5,936,445 A | 8/1999 | Babanezhad et al. ........ 327/157 |
| 6,011,822 A | 1/2000 | Dreyer .......................... 327/157 |
| 6,028,473 A | 2/2000 | Kamei et al. |
| 6,028,780 A | 2/2000 | Chang |
| 6,058,033 A | 5/2000 | Williams et al. |
| 6,064,251 A | 5/2000 | Park |
| 6,067,336 A | 5/2000 | Peng ............................. 327/157 |
| 6,075,406 A | 6/2000 | Lee et al. ..................... 327/157 |
| 6,111,469 A * | 8/2000 | Adachi ......................... 327/157 |
| 6,160,432 A * | 12/2000 | Rhee et al. ................... 327/157 |
| 6,215,363 B1 * | 4/2001 | Conta et al. .................. 327/157 |

OTHER PUBLICATIONS

"Fully–Integrated CMOS Phase–Locked Loop with 15 to 240 MHz Locking Range and +50ps Jitter," Ilya Novof, John Austin, Russ Chmela, Todd Frank, Ram Kelkar, Ken Short, Don Strayer, Mark Styduhar, Steve Wyatt, *ISSCC95/Session 6/Digital Deisgn Elements/Paper TA 6.5.*

"Digital Clocks and Latches," Ian Young, *ISSCC96/Feb. 9, 1996/Sea Cliff/8:30 a.m.*

* cited by examiner

*Primary Examiner*—Terry D. Cunningham
(74) *Attorney, Agent, or Firm*—Thomas, Kayden, Horstemeyer & Risley, L.L.P.

(57) ABSTRACT

This invention provides a charge pump biasing circuit that varies the bias when the phase lock loop changes frequency to improve the settling time of the phase lock loop. During a frequency change, the charge pump output current taper off as the phase lock loop approaches the desired frequency. The charge pump biasing circuit allows the phase lock loop to change frequencies faster and minimizes spurious sideband noise once the loop has settled.

17 Claims, 3 Drawing Sheets

FAST SETTLING CHARGE PUMP

BACKGROUND OF THE INVENTION

1. Technical Field

This invention relates generally to charge pump systems and more particularly, relates to fast settling phase lock loop systems with a charge pump.

2. Related Art

Phase locked loop (PLL) circuits are widely used in many different applications. Five applications of PLL circuits are (1) to lock or align the output clock of a circuit with the clock input, (2) to multiply (i.e., increase) or divide (i.e., decrease) the output frequency of a circuit with respect to the input frequency, (3) to provide clock recovery from signal noise, (4) frequency synthesis, and (5) clock distribution. A PLL circuit controls the frequency of a voltage-controlled oscillator (VCO) such that the VCO provides an output frequency that is adjusted to stay in sync with a reference signal.

A PLL commonly includes a phase detector or phase-frequency detector (PFD), that compares two input signals, a reference signal and a signal from the VCO. The PFD then provides an output of positive or negative pulses, depending on which of the inputs leads the other in phase. The output of the phase detector (PFD), which is an error signal, must then be integrated to provide a control voltage for the VCO. As the error signal approaches zero, the integrator output becomes constant and the VCO frequency is held at a fixed value. When the VCO frequency is held at a fixed value, the PLL is in the "locked" condition. A method of implementing the integration step is to utilize a loop filter, which is commonly an active low-pass filter. The loop filter integrates the voltage pulses from the phase detector (PFD) and provides a steady DC voltage output to the VCO.

A lower cost method of integrating the voltage pulses is to have a charge pump connected with the output of the phase detector. The charge pump generates current pulses that can be integrated by charging a capacitor. In this method, the loop filter is a passive low-pass RC filter. Such a loop filter integrates the current pulses and provides a steady DC voltage that controls the VCO.

A charge pump charges and discharges a loop filter based on the phase difference between the input signals to the charge pump. A conventional pump provides an output current that is the difference between an up-current from a current source connected with a supply voltage and a down-current from a current source (current sink) connected with ground. A transistor turns the current source "on" or "off" and charges the output node, by charging the loop filter which increases the output voltage. Another transistor turns "on" or "off" the currents ink and discharges the output node, by discharging the loop filter which decreases the output voltage. During times that neither charging nor discharging is required, the charge pump presents a high impedance to the loop filter to prevent the loop filter from discharging. Such a high impedance is commonly implemented by (1) turning off the current source and current sink, or (2) turning on the current source and the current sink. When the current source and current sink are turned off, the impedance of the current source and the current sink in the off state must be extremely high. When the current source and the current sink are turned on, the up and down currents must be substantially matched. The matched currents prevent unwanted charging or discharging of the loop filter and maintains a constant output voltage from the loop filter.

When a conventional PLL with a charge pump is locked, any mismatch in the current source results in a leakage to or from the loop filter that results in sideband tones, also called spurs, in the output signal. A perfectly matched charge pump in the locked condition would not output charge pulses, because the VCO control voltage would remain constant without the need to refresh the loop filter. If the charge pump is not perfectly matched some leakage will occur. The leakage requires the loop filter to be refreshed. A larger leakage require a larger refresh current. To generate a larger refresh current, the charge pump must source or sink current with a larger duty cycle. When a conventional charge pump's control signals are switched on and off at a rate called the "comparison frequency", a refresh charge injection results in undesirable fluctuations in the voltage from the loop filter to the VCO. The refresh charge injection causes undesirable fluctuations in the output frequency from the VCO. Such fluctuations occur at comparison frequency and generate sideband spurs. The sideband spurs occur at frequencies spaced from the VCO's main output frequency by an amount equal to the comparison frequency. The sideband spurs tend to occur equally above and below the VCO's main output frequency.

The VCO output frequency varies based on an input voltage. A VCO typically outputs a sine wave. As the input voltage to the VCO increases, the output frequency from the VCO also increases. The dynamic range oft he output voltage of a charge pump is an important factor in determining the maximum range and accuracy of the lock frequencies of the PLL.

Conventional PLLs generate undesired spectra (noise), such as spurious sideband tones, phase noise, and switching noise. The undesired spectra in the PLL's output signal generally includes glitches of energy, especially spurious sideband signals, discrete tones, and spread-frequency noise. In a PLL, the unwanted tones and noise may be created by a clock source feed through, charge injection at a P-type Mosfet (PMOS) or N-type Mosfet (NMOS) switching transistor, or another source. Also, the switching nodes of conventional charge pumps often have charge sharing resulting from parasitic capacitance.

The settling time of a PLL can be reduced by adjusting the PLL's bandwidth during the settling process. The settling time is the time required for the PLL to change frequencies. To improve the settling time, the resistance of the loop filter may be adjusted by switching an additional resistor into the loop filter's RC circuit during the settling process. The additional resistor is switched into the RC circuit at a predetermined time during the settling process. Alternatively, the additional resistor is switched into the RC circuit during the settling process when the charge pump causes a step change in the charge pump current. These processes attempt to narrow the PLL's bandwidth after much of the settling process is completed. Such switching in the loop filter and the charge pump cause undesirable large transient signals in the loop filter's output. The transients cause the PLL's frequency of the output signal to fluctuate jump away) from the desired frequency, causing the settling time of the PLL to increase, thereby defeating the purpose of the switching.

Alternatively, the settling time of a PLL can be reduced by increasing the reference clock's frequency and/or using a fractional-N PLL. These options allow a wider loop bandwidth and increases the speed of the PLL. The phase and frequency detector (PFD) in these options requires additional circuitry to handle the increased frequency. A PLL with a wider loop bandwidth that is a fixed width is not be desirable, because the in-band noise from the phase detector and the main frequency divider are positively correlated to the loop bandwidth. That is, a wider loop bandwidth results in increased in-band noise.

It is therefore desirable to have a PLL with a charge pump that settles to new frequencies quickly without generating transients, and without requiring an excessive width fixed loop bandwidth when the PLL is in the settled ("locked") state. Further limitations and disadvantages of conventional systems will become apparent to one of skill in the-art after reviewing the remainder of this patent application with reference to the drawings.

SUMMARY

This invention provides a charge pump biasing circuit that varies the bias when the phase lock loop changes frequency to improve the settling time of the phase lock loop. During a frequency change, the charge pump output current taper off as the phase lock loop approaches the desired frequency. The charge pump biasing circuit allows the phase lock loop to change frequencies faster and minimizes spurious sideband noise once the loop has settled.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts throughout the different views.

DETAILED DESCRIPTION OF THE PREFERRED EMBODIMENTS

A charge pump with continuous current decay can be used to reduce the settling time of a phase lock loop. Advances in portable devices, such as cellular telephones, create a need for such charge pumps and phase lock loops. Portable devices operate at high speeds and require a phase lock loop with a faster settling time. Often such phase lock loops are formed on a semiconductor substrate.

Figure 1:
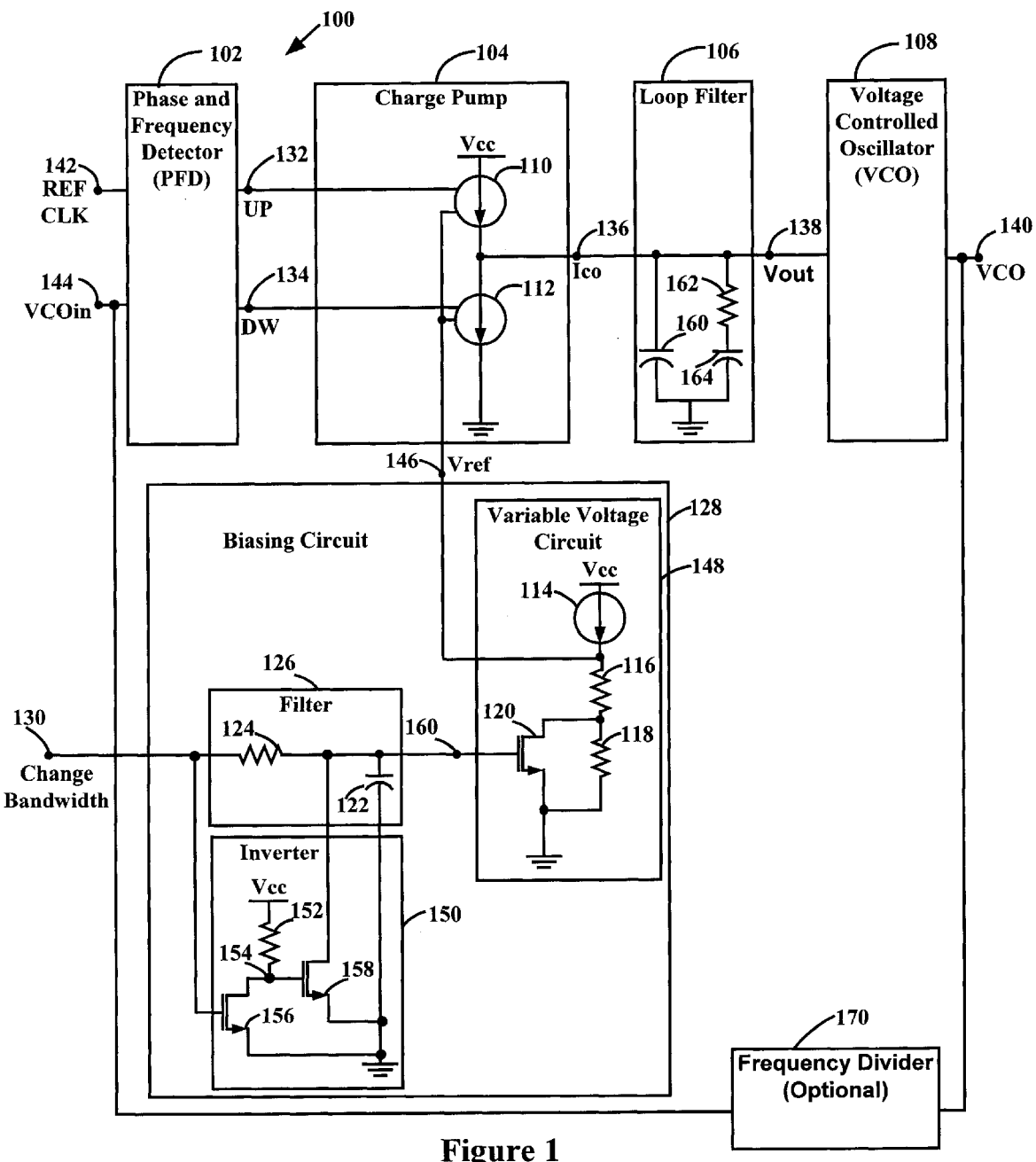
FIG. 1 is a schematic block diagram illustrating an embodiment of a fast settling phase lock loop with an improved charge pump.

FIG. 1 illustrates an example of a phase-locked loop (PLL) 100 that includes a phase and frequency detector (PFD) 102, a charge pump 104, a loop filter 106, and a voltage controlled oscillator (VCO) 108. FIG. 1 illustrates the charge pump 104 with the biasing circuit 128 in a phase lock loop circuit 100. Other applications for the charge pump 104 with the biasing circuit 128 include but are not limited to frequency synthesizers, clock-phase synchronization circuits, clock distribution circuits, and others.

An optional frequency divider 170 can be added between the VCO 108 and the PFD 102. The frequency divider 170 may be an integer-N or a fractional-N divider. For example, if the reference clock received at node 142 is substantially 200 kHz and the frequency divider 170 is set to a divide ratio of 4500, the VCO 108 settles to a frequency of substantially 900 MHz. If the frequency divider 170 is set to a divide ratio of 4501, the VCO 108 settles to a frequency of substantially 900.2 MHz. In this example, the PLL 100 has a channel spacing of 200 kHz. In another embodiment used in IS-136 communication, the channel spacing is 30 kHz. The channel spacing may be any desirable channel spacing, including but not limited to 0.1 kHz to 100 MHz.

The phase and frequency detector 102 receives two input signals, a VCOin signal and a reference clock signal (Ref Clk) at input nodes 144 and 142, respectively. The reference clock signal may be provided by a crystal reference oscillator and a reference divider that adjusts the reference frequency signal. For example, a Global Systems for Mobile Communication (GSM) based cellular telephone may have a crystal reference oscillator that generates a reference frequency signal at 13 MHz and a reference divider that divides the reference frequency signal by 65. The divided reference frequency, a comparison frequency signal at 200 kHz, is provided to the input node 142. The VCOin signal may be provided from the VCO 108 or the optional frequency divider 170. The phase and frequency detector 102 compares the two input signals and provides two control signals, UP and DW, to the charge pump 104 at input nodes 132 and 134, respectively. A change in the control signals, UP and DW, may include a change in only one or in both of the control signals. When the two input signals are in phase, the PLL 100 is locked, and the control signals have identical phases and frequencies.

The charge pump 104 responds to the control signals, UP and DW, from the PFD 102 and outputs a current signal, Ico, to the loop filter 106 at output node 136. The output current signal, Ico, is responsive on the control signals. The charge pump 104 includes a current source circuit 110 and a current sink circuit 112. The output current signal, Ico, from the charge pump 104 is substantially the difference between the current sourced from the current source circuit 110 and the current drawn by the current sink circuit 112. The current source circuit 110 is controlled by the UP signal received from the PFD at node 132 and a reference bias voltage, Vref. The biasing circuit 128 provides the reference bias voltage at node 146. The current sink circuit 112 is controlled by the DW signal received from the PFD at node 134 and the reference bias voltage, Vref, at node 146. In an alternative embodiment, separate biasing circuits are used for the current source circuit 110 and the current sink circuit 112. Such biasing circuits may have voltage ranges, decay rates, or other characteristics that are different from the other biasing circuit.

In one embodiment, the current source circuit 110 and the current sink circuit 112 generate source and sink current substantially proportional to their reference bias voltages. The current source circuit 110 and the current sink circuit 112 may each have an internal biasing circuit that controls the output based on the biasing signal. In one embodiment, the biasing circuit 128 is integrated with the charge pump 104.

In one embodiment, the biasing circuit 128 includes a pulse shaping filter 126 and a variable voltage circuit 148. The filter 126 may comprise an RC, RLC, RL, transistor or other filter. The filter 126 may include an resistor 124 connected with a capacitor 122 that is connected with ground. The capacitor 122 is configured to retain a voltage charge for a period of time. The shaping filter 126 converts the input signal at input node 130 to a waveform for the variable voltage circuit 148. For example, if the "Change Bandwidth" signal received at input node 130 is a step function between −2.7 Volts and ground, the shaping filter 126 converts the step function to a waveform that asymptotically transitions from −2.7 volts to ground.

In one embodiment, the biasing circuit 128 includes an inverter circuit 150. The inverter circuit 150 generates a signal at an inverted node 154 that is substantially the inverse of the change bandwidth signal received at the input node 130. A transistor 156 received the change bandwidth signal from the input node 130. The transistor 156 will switch on and off as a function of the change bandwidth signal. When the change bandwidth signal is low the transistor 156 turns off. When the transistor 156 turns off, the inverted node 154 is pulled up to near Vcc by the pull-up resistor 152. The transistor 158 then turns on causing a short across the terminals of the capacitor 122. When the capacitor 122 is shorted, any charge in the capacitor 122 will be quickly discharged. As the capacitor 122 quickly discharges, the reference voltage at the reference node 146 quickly increases.

When the change bandwidth signal goes high, the transistor 156 turns on and substantially shorts the inverted node 154 to ground. When the inverted node 154 is grounded, the transistor 158 turns off. With the transistor 158 turned off, the capacitor 122 gradually charges back up. As the capacitor 122 charges, the voltage reference at the reference node 146 gradually decays. Because the reference voltage at the reference node 146 increases rapidly when the change bandwidth signal goes low, the charge pump 104 rapidly switches to a "fast mode." Because the reference voltage at the reference node 146 decreases slowly when the change bandwidth signal goes high, the charge pump 104 gradually switches to a "slow mode." In this embodiment, the charge pump 104 rapidly switches to the fast mode and gradually switches to the slow mode. Alternatively, the charge pump 104 can switch rapidly to the fast and the slow mode. The switching speed can be adjusted by adjusting the rate the capacitor 122 charges up and discharges.

Figure 2:
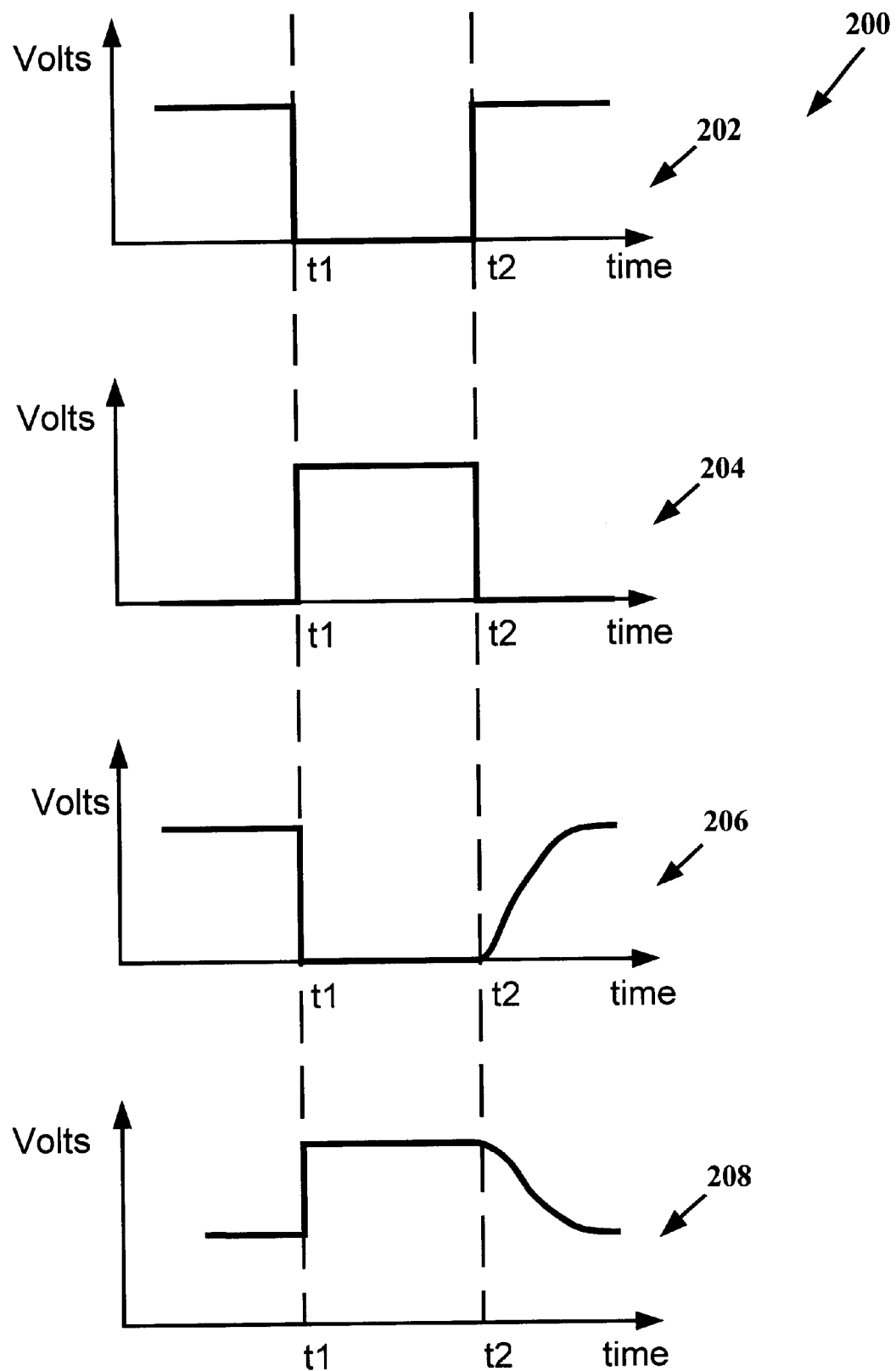
FIG. 2 is a set of diagrams illustrating the voltage level versus time at several nodes in the schematic block diagram of FIG. 1.

FIG. 2 illustrates a timing diagrams 200 that illustrates an example of the voltage levels at various locations in an embodiment of the PLL 100 of FIG. 1. The timing diagrams 200 are shown to illustrate generally the changes in voltage levels near two time intervals called "t1" and "t2." The timing diagrams are not necessarily to scale or proportionate to each other. The voltage values and rates of change may vary in different embodiments. For example, the voltages that appear to reach the x-axis may not be zero volts and lines that appear to be vertical or horizontal may be sloped, have voltage ripples, may be delayed, or otherwise vary from the waveforms shown in FIG. 2. The x-axis that represents time is also not necessarily proportionate. For example, the pulse width from time t1 to time t2 may be significantly shorter than the time required for the voltage levels in timing diagrams 206 and 208 to settle to the new voltage level.

The first timing diagram 202 shows the change bandwidth signal received at node 130. The change bandwidth signal switches from high to low at time t1 indicating a change in the bandwidth of the PLL 100 is desired. When the bandwidth of the PLL 100 changes, the PLL 100 should enter the fast mode. At time t2, the change bandwidth signal switches from low to high indicating the change in the bandwidth of the PLL 100 is substantially over. When the change in the bandwidth of the PLL 100 is is substantially over, the PLL 100 should enter the slow mode.

The second timing diagram 204 shows the voltage level at the inverted node 154. The voltage level at the inverted node 154 is substantially the inverse of the change bandwidth signal received at the input node 130.

The third timing diagram 206 shows the voltage level at the node 160. The voltage level at the node 160 decreases rapidly when the PLL 100 receives a change bandwidth signal at time t1. The voltage level at the node 160 increases slowly when the change bandwidth signal is raised at time t2. In an embodiment, the voltage level after time t2 returns to substantially the same voltage as before time t1.

The fourth timing diagram 208 shows the voltage level at the node 146. The voltage level at the node 146 increases rapidly when the PLL 100 receives a change bandwidth signal at time t1. The voltage level at the node 146 decreases slowly when the change bandwidth signal is raised at time t2. In an embodiment, the voltage level after time t2 returns to substantially the same voltage as before time t1.

Referring again to FIG. 1, the variable voltage circuit 148 provides the bias voltage signal or the voltage reference signal (Vref) at the reference node 146. The variable voltage circuit 148 may include an input transistor 120, a pair of resistors 116 and 118 in series and a current source 114 connected with the resistor pair 116 and 118. The transistor 120 may be an N-type enhancement mode MOSFET or an N-type JFET. A JFET transistor is desirable because JFET have are a good voltage-variable resistor (VVR). JFETs are good VVR because of the I-V characteristic is bipolar at small AC voltages. If the transistor 120 is a JET, the JFET transistor 120 would require a negative gate voltage. An N-channel enhancement MOSFET is preferred because a positive gate voltage can be used to achieve the VVR. Other circuits may also be used for the input circuit. In one embodiment, the biasing signal decays asymptotically from a first voltage to a second voltage.

For example, the biasing signal may decay asymptotically from 2.7 Volts to ground. In this example, the variable voltage circuit 148 receives an asymptotically increasing signal at the gate of the transistor 120. As the gate voltage increases, the drain to source resistance of the transistor 120 decreases from substantially an open circuit to substantially a short circuit. This causes the effective resistance of the pair of resistors 116 and 118 to decrease from the sum of the resistance of both resistors to the resistance of only the resistor 116. As the effective resistance changes, the voltage level at the output of the current source 114 decays from a higher voltage to a lower voltage based on Equation 1.

$$Vref = Iref * Reff \qquad \text{Eqn. 1}$$

Where:

Vref is the output voltage from the variable voltage circuit 148 at node 146;

Iref is the characteristic current of the current source 114; and

Reff is the effective resistance of the variable voltage circuit 148.

In one embodiment, the biasing circuit 128 receives the change bandwidth control signal at input node 130. When the PLL is changing frequencies the change bandwidth signal charges the capacitor 122 through the relatively small resistance of the input resistor 124. The charged capacitor 122 turns on the transistor 120. When the change bandwidth signal no longer indicates the PLL 100 is changing frequencies (0 volt input), the capacitor 122 slowly discharges through the higher impendence circuit that includes the transistor 120 and the resistor pair 116 and 118. This causes the biasing reference voltage, Vref, at node 146 to slowly decrease shortly after the PLL 100 begins to change frequencies. The rate of decrease may be calibrated for various charge pumps by adjusting the resistance of resistors 116 and 118 and the characteristics of the transistor 120.

The current source circuit 110 and the current sink circuit 112 receive the reference voltage signal, Vref, from the biasing circuit 128 and adjust the charge pump's output current signal, Ico, based on the reference voltage signal. The output current signal, Ico, is larger shortly after a frequency change and then gradually decreases (decays) as the PLL settles to the new frequency. As the output current decreases, the bandwidth of the PLL is reduced, limiting spurious sideband noise without causing transients.

The loop filter 106 generates a signal, Vout, to the voltage controlled oscillator (VCO) 108 based on the input current signal, Ico. The loop filter 106 filters out some of the noise in the input current. The loop filter 106, as illustrated in FIG. 1, is a low pass filter (LPF) that includes an RC circuit. An example of a second order LPF includes a resistor 162 and a first capacitor 164 in series connected in parallel with a second capacitor 160. Alternatively, the loop filter 106 may include only the resistor 162 and the capacitor 164 in series. While the charge pump 104 and the loop filter 106 are illustrated as separate devices, the term "charge pump" may include a charge pump with an integrated loop filter.

The output current from the charge pump 104 is generated from the differences of matched current sources, that is a current source matched with a current sink, in order to maintain a constant output voltage from the loop filter 106 and thus maintain a constant frequency oscillation signal from the VCO 108. Otherwise, the input signals to the phase and frequency detector 102 are out of phase, the phase and frequency detector 102 changes the duty cycles of control signals until the PLL 100 becomes stable. This process is called settling of the PLL 100.

When the signal "VCOin" trails the reference clock signal, REF CLK, the duty cycle of control signal UP is increased relative to the duty cycle of control signal DW. The increased duty cycle of the control signal UP increases the output current signal, Ico, from the charge pump 104 and thus increases the output voltage signal (Vout) at the output node 138 from the loop filter 106. The increased output voltage signal (Vout) causes an increase in the oscillation frequency of the frequency signal (VCO) at the output node 140 from the VCO 108. The optional frequency divider 170 can adjust the frequency of the frequency signal (VCO) and provide the PFD 102 with an adjusted frequency signal VCOin. Alternatively, the frequency signal (VCO) can be feedback to the PFD 102 directly. This cycle is repeated until the two inputs, VCOin and REF CLK, are synchronized and the PLL is settled.

The reference clock, REF CLK, received by the PLL 100 at input node 142 may be substantially equal to the channel spacing of the system that the PLL 100 is used in. The reference clock may contain undesirable spurious tones. Such spurious tones cause sideband noise in the PLL's output signal. The PLL's bandwidth limits sideband noise. For example, the PLL's bandwidth may be one tenth (1/10) or one twentieth (1/20) of the reference clock's frequency. A PLL with such a reduced bandwidth may change frequencies substantially slower than a full bandwidth PLL. It is desirable to have the PLL change frequencies a quickly as possible. The PLL 100 is "fast" when the charge pump's 104 output current is larger and "slower" when the output current is less. Thus, the bandwidth of the PLL 100 is dynamically controlled to optimize the PPL speed. Many devices would benefit from a PLL 100 that reduced sideband noise without significantly slowing the settling time. For example, memory devices, central processing units, and cellular telephones that use the time domain multiple access (TDMA), GSM, or other communication protocols may use a PLL to lock to various frequencies and rapidly switch between frequencies. Such a cellular telephone would benefit from a PLL with reduced sideband noise and a faster settling time. Such an improved PLL may also be used in portable wireless communications including PCS, PCN, CDMA, and cordless telephones, dual mode cellular telephones, spread spectrum communication systems, and cable television applications.

As the charge pump's 104 output current, Ico, changes, the loop gain and the phase margins may dynamically change. Therefore it is desirable to limit the change in loop bandwidth to provide a more stable PLL 100. The change in the loop bandwidth may be limited to a factor of two or three during transitions.

Figure 3:
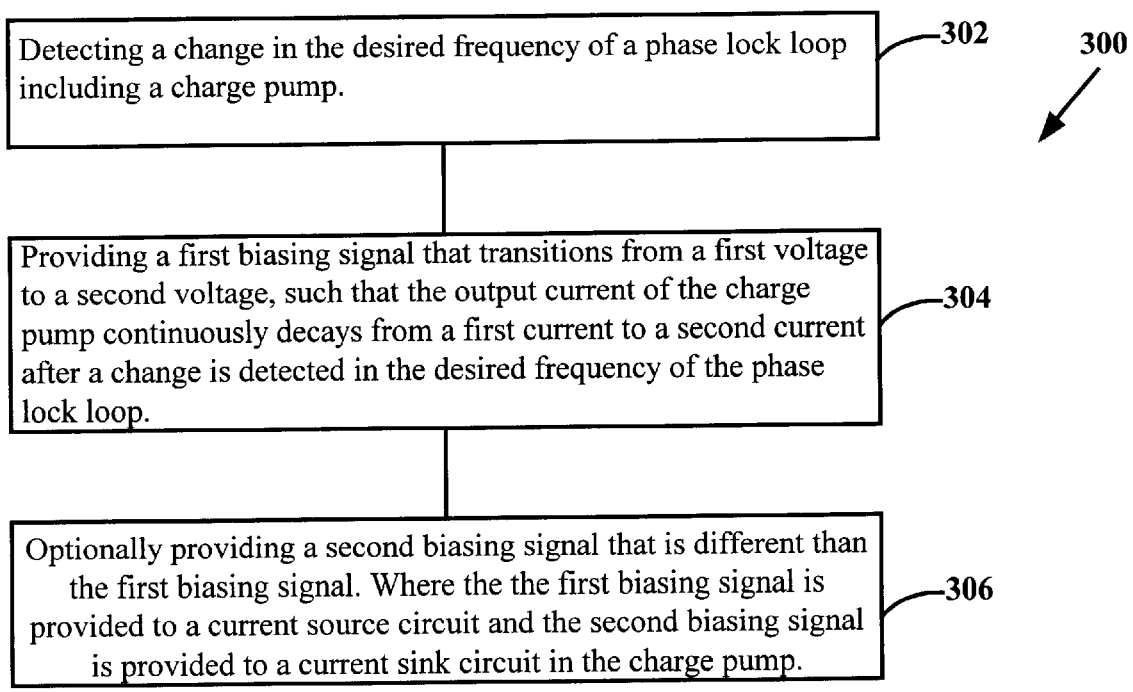
FIG. 3 is a flowchart illustrating an embodiment of a method for controlling the output current of the charge pump in FIG. 1.

FIG. 3 illustrates a method 300 of controlling the output current of a charge pump in a phase lock loop. In 302, a change in the desired frequency of the phase lock loop that includes a charge pump is detected. For example, a control signal may be received that indicates a change in the desired frequency of the phase lock loop.

In 304, after detecting a change in the desired frequency, a first biasing signal is provided to the charge pump to cause the output current of the charge pump to continuously decay from a first current to a second current. The first biasing signal may transition between voltage levels to achieve the decay of the output current.

In 306, an optional second biasing signal may be applied to the charge pump. When the first and second biasing signal are applied to the charge pump, the second biasing signal is different than the first biasing signal and the first biasing signal may be applied to the current source circuit and the second biasing signal may be applied to the current sink circuit in the charge pump.

The fast settling charge pump with reduced spurious sideband noise described above are suitable for use in portable devices, such as cellular telephones, computers, and other electronic devices, including such devices that implement the global system for mobile communication (GSM). While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A charge pump comprising:

a first biasing circuit;

a second biasing circuit;

a current source circuit that receives a first control signal from a phase and frequency detector and a first biasing signal from the first biasing circuit;

a current sink circuit that receives a second control bias signal from the phase and frequency detector and a second biasing signal from the second biasing circuit;

a change-bandwidth signal that causes the first biasing circuit to transmit the first biasing signal and causes the second biasing circuit to transmit the second biasing signal, wherein the first biasing signal and the second biasing signal each having one transition between voltage levels of duration different than that of the change bandwidth signal; and an output node connected between the current source circuit and the current sink circuit.

2. The charge pump of claim 1, where the first biasing circuit comprises a first variable voltage circuit that provides the first biasing signal that decays from a first voltage down to a second voltage.

3. The charge pump of claim 2, where the second biasing circuit comprises a second variable circuit that provides the second biasing signal that decays from a third voltage down to a fourth voltage.

4. The charge pump of claim 3, where the first voltage is different than the third voltage.

5. The charge pump of claim 3, where the first variable voltage circuit decays from the first voltage to the second voltage at a first decay rate and the second variable voltage circuit decays from the third voltage to the fourth voltage at a second decay rate, where the first decay rate is different than the second decay rate.

6. The charge pump of claim 5, where the first voltage and the third voltage are substantially the same.

7. The charge pump of claim 5, where the output node provides an asymptotically decaying output current after the change-bandwidth signal changes.

8. The charge pump of claim 5, where the charge pump and the first and second biasing circuits are fabricated on a semiconductor substrate.

9. The charge pump of claim 1, where the first and second biasing circuits each comprise a shaping filter connected with a variable voltage circuit.

10. A charge pump, comprising:
    means for providing a first biasing signal;
    means for providing a second biasing signal;
    means for receiving a first control signal, from a phase and frequency detector, and the first biasing signal;
    means for receiving a second control signal, from the phase and frequency detector, and the second biasing signal; and
    means for providing a change-bandwidth signal that causes the means for providing a first biasing signal to transmit the first biasing signal and causes the means for providing a second biasing signal to transmit the second biasing signal, wherein the first biasing signal and the second biasing signal transition each having one between voltage levels of duration different than that of the change-bandwidth signal;
    said means for receiving a first control signal and said means for receiving a second control signal together.

11. The charge pump of claim 10, wherein the first biasing signal decays from a first voltage down to a second voltage.

12. The charge pump of claim 11, wherein the second biasing signal decays from a third voltage down to a fourth voltage.

13. The charge pump of claim 12, where the first voltage is different than the third voltage.

14. The charge pump of claim 13, where the first biasing signal decays from the first voltage to the second voltage at a first decay rate and the second biasing signal decays from the third voltage to the fourth voltage at a second decay rate, where the first decay rate is different than the second decay rate.

15. The charge pump of claim 14, where the first voltage and the third voltage are substantially the same.

16. The charge pump of claim 14, where the output current asymptotically decays after the change-bandwidthsignal changes.

17. The charge pump of claim 14, where the charge pump and the means for providing a first biasing signal and the means for providing a second biasing signal are fabricated on a semiconductor substrate.

* * * * *

UNITED STATES PATENT AND TRADEMARK OFFICE
CERTIFICATE OF CORRECTION

PATENT NO.    : 6,466,069 B1
DATED         : October 15, 2002
INVENTOR(S)   : Rozenblit et al.

It is certified that error appears in the above-identified patent and that said Letters Patent is hereby corrected as shown below:

Column 10,
Line 6, after the word "signal," please delete "transition"
Line 7, after the word "one," please insert -- transition --

Signed and Sealed this

Twenty-fifth Day of February, 2003

JAMES E. ROGAN
*Director of the United States Patent and Trademark Office*